United States Patent [19]

Okada

[11] Patent Number: 4,467,289

[45] Date of Patent: Aug. 21, 1984

[54] CURRENT MIRROR CIRCUIT

[75] Inventor: Takashi Okada, Yokohama, Japan

[73] Assignee: Sony Corporation, Tokyo, Japan

[21] Appl. No.: 480,417

[22] Filed: May 2, 1983

Related U.S. Application Data

[63] Continuation of Ser. No. 203,978, Nov. 4, 1980, abandoned.

[30] Foreign Application Priority Data

| Nov. 5, 1979 | [JP] | Japan | 54-143025 |
| Nov. 5, 1979 | [JP] | Japan | 54-143026 |
| Feb. 26, 1980 | [JP] | Japan | 55-23247 |
| Feb. 29, 1980 | [JP] | Japan | 55-25544 |

[51] Int. Cl.³ .................................................. H03F 3/04
[52] U.S. Cl. ....................................... 330/288; 323/315
[58] Field of Search ............... 330/257, 288; 323/315, 323/316

[56] References Cited

U.S. PATENT DOCUMENTS

| 3,614,645 | 10/1971 | Wheatley, Jr. | 330/257 X |
| 3,629,691 | 12/1971 | Wheatley, Jr. | 323/315 |
| 3,813,607 | 5/1974 | Voorman | 323/315 X |
| 3,992,676 | 11/1976 | Knight | 330/288 X |

OTHER PUBLICATIONS

IBM Technical Disclosure Bulletin, vol. 16, No. 7, Dec. 1973, by G. A. Hellwarth et al.

*Primary Examiner*—James B. Mullins
*Attorney, Agent, or Firm*—Hill, Van Santen, Steadman & Simpson

[57] ABSTRACT

A current mirror circuit is disclosed which includes a power supply source, a series circuit of a current source and the collector-emitter path of a first transistor connected between the power supply source and a reference voltage source, a second transistor circuit having a control electrode connected with the base of the first transistor and a main current path connected between the base of the first transistor and the reference voltage source, a third transistor circuit having a control electrode connected with the collector of the first transistor and a main current path one terminal of which is connected with the base of the first transistor, and fourth transistor circuit having a control electrode connected with the base of the first transistor and a main current path one terminal of which is connected with the reference voltage source.

15 Claims, 16 Drawing Figures

CURRENT MIRROR CIRCUIT

This is a continuation of application Ser. No. 203,978, filed Nov. 4, 1980, now abandoned.

BACKGROUND OF THE INVENTION

1. Field of the Invention

This invention relates generally to a current mirror circuit and, more particularly, is directed to a current mirror circuit for converting a single input current to an single output which is N times as much as the input current or for converting a single input current to a plurality of outputs the value of which can be chosen as desired.

2. Description of the Prior Art

Figure 1:
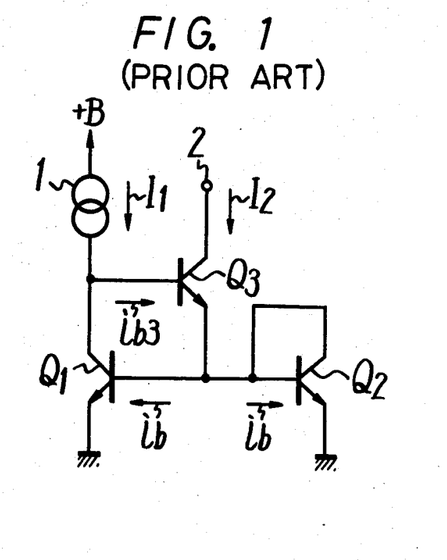
FIGS. 1 to 3 are respectively schematic diagrams of prior art current mirror circuits having a single output.

Current mirror circuits, for example, for converting a single input current to an output current which is substantially equal to the input current are known in the art. Referring now to FIG. 1, there is shown one such current mirror circuit including a current supply source 1, a first transistor $Q_1$ having its collector-emitter path connected between the current supply source 1 and a reference voltage source, a second transistor $Q_2$ having its base and collector conntected together with the base of the first transistor $Q_1$ and the emitter connected with the reference voltage source, and a third transistor $Q_3$ having its base-emitter path connected in parallel with the collector-base path of the first transistor $Q_1$ and the collector connected with an output terminal 2.

In this art, the base current $i_{b3}$ of the third transistor $Q_3$ is represented as follows:

$$i_{b3} = \frac{h_{fe} + 2}{h_{fe} + 1} \cdot i_b \tag{1}$$

where
$h_{fe}$=current gain of the transistors $Q_1$-$Q_3$
$i_b$=base current of the transistors $Q_1$ and $Q_2$ On the other hand, the input current $I_1$ from the current supply source 1 is represented as follows:

$$I_1 = \frac{h_{fe}^2 + 2h_{fe} + 2}{h_{fe} + 1} \cdot i_b \tag{2}$$

Further, the output current $I_2$ obtained from the collector of the transistor $Q_3$ is represented as follows:

$$I_2 = \frac{h_{fe}^2 + 2h_{fe}}{h_{fe} + 1} \cdot i_b \tag{3}$$

From the above equations (2) and (3), $I_2$ is represented as follows:

$$I_2 = \frac{h_{fe}^2 + 2h_{fe}}{h_{fe}^2 + 2h_{fe} + 2} \cdot I_1 \tag{4}$$

From the equation (4), current gain $I_2/I_1$ of this current mirror circuit is substantially equal to 1, regardless of the value of $h_{fe}$.

Figure 2:
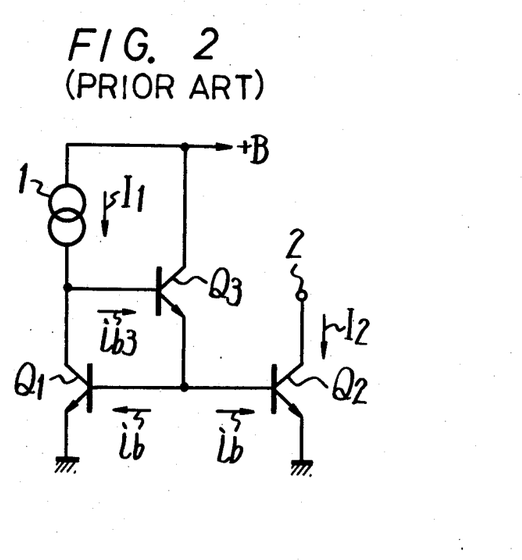

Referring further to FIG. 2, a second known current mirror circuit is also proposed, in which the circuit construction is the same as the first known circuit except that the output current $I_2$ is drawn from the collector of the transistor $Q_2$ and the collector of the transistor $Q_3$ is connected with the power supply source of $+B$.

From the above second circuit, the output current $I_2$ is represented as follows in the same way as that of the first known circuit:

$$I_2 = \frac{h_{fe}^2 + h_{fe}}{h_{fe}^2 + h_{fe} + 2} \cdot I_1 \tag{5}$$

The equation (5) shows that the second known circuit is also adequate when the output current $I_2$ is required to be substantially equal to the input current $I_1$ regardless of the variation of $h_{fe}$.

In the second known circuit, however, the output current $I_2$ does not respond to the input current $I_1$ when the input current varies in a high frequency, for example, 30 MHz by the effect of the storage delay-time of the transistors $Q_1$ and $Q_2$, because there is no current path that releases the base currents of transistors $Q_1$ and $Q_2$.

It is now realized from the above description that the high accuracy of $I_2/I_1$ toward 1 is available from the prior art circuits. However, when an output current which is n times as much as the input current is required, the current gain $I_2/I_1$ is not accurately equal to n in accordance with the construction of the above mentioned circuits.

Figure 3:
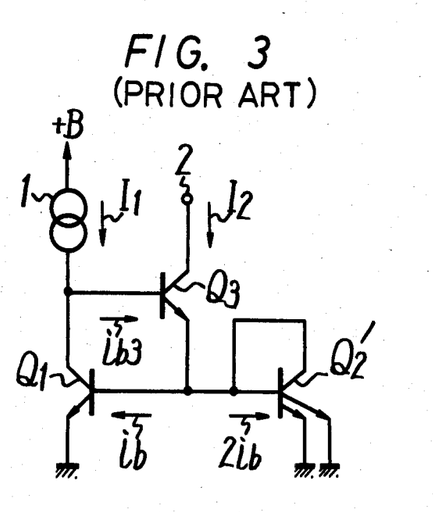

Referring to FIG. 3, for example, if the emitter area of the transistor $Q_2'$ is formed twice as large as that of transistors $Q_1$ and $Q_3$, for example, the base current of the transistor $Q_2'$ is represented as $2i_b$ and the base current $i_{b3}$ of the transistor $Q_3$ becomes as follows:

$$i_{b3} = \frac{2h_{fe} + 3}{h_{fe} + 1} \cdot i_b \tag{6}$$

The input current $I_1$ is represented as follows:

$$I_1 = \frac{h_{fe}^2 + 3h_{fe} + 3}{h_{fe} + 1} \cdot i_b \tag{7}$$

The output current $I_2$ is represented as follows:

$$I_2 = \frac{2h_{fe}^2 + 3h_{fe}}{h_{fe} + 1} \cdot i_b \tag{8}$$

From the equations (7) and (8), the current gain $I_2/I_1$ of this circuit is represented as follows:

$$I_2/I_1 = 2 \cdot \frac{h_{fe}^2 + 1.5h_{fe}}{h_{fe}^2 + 3h_{fe} + 3} \tag{9}$$

The equation (9) shows that coefficients of $h_{fe}$ are different between the denominator and the numerator, therefore the $I_2/I_1$ is not accurately equal to 2. Especially, in case where the value of $h_{fe}$ is small or the frequency of the input current $I_1$ is high, the current gain $I_2/I_1$ becomes less accurate.

Figure 4:
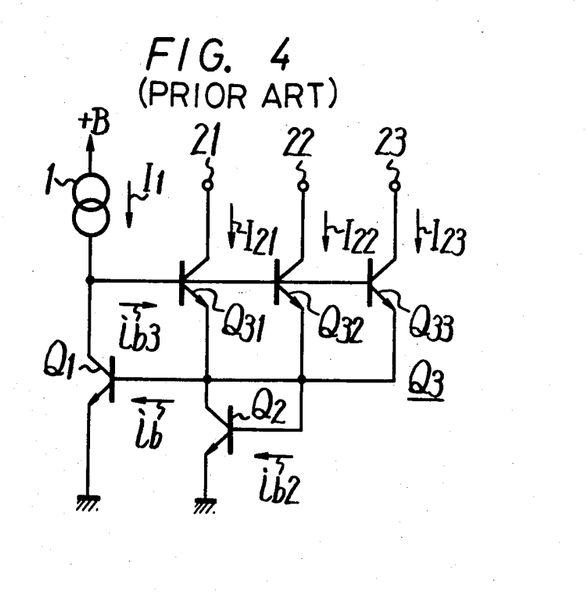
FIG. 4 is a schematic diagram of a prior art current mirror circuit having a plurality of outputs.

In another case, if a plurality of output currents, which have either different values or the same value, are required, the first known circuit is modified to have a plurality of output transistors. As shown in FIG. 4, for example if three different output currents $I_{21}$, $I_{22}$ and $I_{23}$, the proportion of which to the input current $I_1$ are p, q and r, respectively are required from the output terminals 21, 22 and 23, three output transistors $Q_{31}$, $Q_{32}$ and $Q_{33}$, whose emitter areas are proportional to the emitter area of the transistor $Q_1$ are p, q and r, respectively, for example, are needed and the emitter area of the transistor $Q_2$ is to be formed (p+q+r) times as large as the emitter area of the transistor $Q_1$.

In this case, the base current $i_{b2}$ of the transistor $Q_2$ is represented as follows:

$$b_{b2} = (p+q+r) \cdot i_b \qquad (10)$$

Therefore, the sum of emitter currents of the transistors $Q_{31}$, $Q_{32}$, $Q_{33}$ is represented as follows.

$$\{(p+q+r)\cdot(h_{fe}+1)+1\}\cdot i_b \qquad (11)$$

Therefore, the sum of base currents of the transistors $Q_{31}$, $Q_{32}$, $Q_{33}$ is represented as follows:

$$i_{b3} = \frac{\{(p+q+r)\cdot(h_{fe}+1)+1\}}{h_{fe}+1} \cdot i_b \qquad (12)$$

Therefore, the input current $I_1$ is represented as follows.

$$I_1 = h_{fe} \cdot i_b + i_{b3} \qquad (13)$$

$$= \frac{h_{fe}^2 + (p+q+r+1)\cdot h_{fe} + (p+q+r+1)}{h_{fe}+1} \cdot i_b$$

The output current $I_{21}$ is obtained from the equation (6) as follows:

$$I_{21} = \frac{p \cdot \{(p+r+q)\cdot(h_{fe}+1)+1\}\cdot h_{fe}}{(p+q+r)\cdot(h_{fe}+1)} \cdot i_b \qquad (14)$$

$$= \frac{ph_{fe}^2 + \left(p + \frac{p}{p+q+r}\right)\cdot h_{fe}}{h_{fe}+1} \cdot i_b$$

From the equations (13) and (14) the output current $I_{21}$ is further represented as follows:

$$I_2 = p \cdot \frac{h_{fe}^2 + \left(1 + \frac{1}{p+q+r}\right)\cdot h_{fe}}{h_{fe}^2 + (p+q+r+1)\cdot h_{fe} + (p+q+r+1)} = I_1 \qquad (15)$$

The other output currents $I_{22}$ and $I_{23}$ are obtained by substituting q and r for the coefficient p of the equation (15).

In the equation (15), however, coefficients of $h_{fe}$ are quite different between the denominator and the numerator, so that the current gain $I_{21}/I_1$ is not p accurately. Therefore, from the circuit described above, plural number of output currents which have accurate current ratio to the input current are not available.

OBJECTS AND SUMMARY OF THE INVENTION

Accordingly, it is an object of this invention to provide a current mirror circuit in which the current gain is accurately n regardless of the value of $h_{fe}$ of transistors.

Another object of this invention is to provide a current mirror circuit in which obtained are a plurality of outputs the value of which can be chosen as desired regardless of the value of $h_{fe}$ of transistors.

A further object of this invention is to provide a current mirror circuit in which the output current responds immediately to the input current of high frequency, for example 30 MHz.

In accordance with an aspect of this invention, a current mirror circuit is provided which includes a power supply source; a series circuit of a current source and the collector-emitter path of a first transistor connected between the power supply source and a reference voltage source; a second transistor circuit having a control electrode connected with the base of the first transistor and a main current path connected between the base of the first transistor and the reference voltage source; a third transistor circuit having a control electrode connected with the collector of the first transistor and a main current path one terminal of which is connected with the base of the first transistor; and a fourth transistor circuit having a control electrode connected with the base of the first transistor and a main current path one terminal of which is connected with the reference voltage source.

The other objects, features and advantages of the present invention will become apparent from the following description taken in conjunction with the accompanying drawings through which the like references designate the same elements and parts.

DESCRIPTION OF THE PREFERRED EMBODIMENTS

Referring to the drawings and initially to FIG. 5, one embodiment of a current mirror circuit according to this invention will be described.

Figure 5:
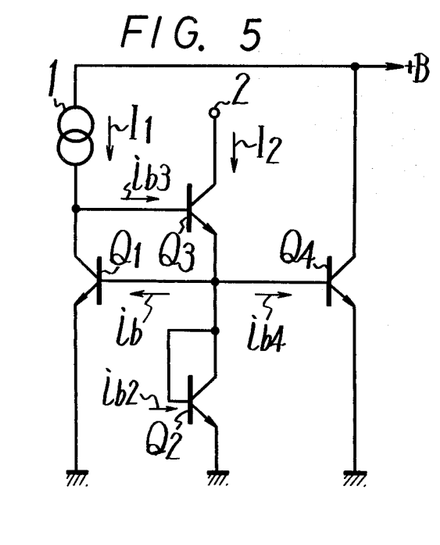
FIGS. 5 to 7 and FIGS. 11 to 13 are respectively schematic diagrams of current mirror circuits each having a single output according to this invention.

In FIG. 5, a series circuit of a current source 1 and the collector-emitter path of transistor $Q_1$ is connected between a power supply source of +B and the reference voltage source, the base and the collector of transistor $Q_2$ is connected together with the base of transistor $Q_1$, with the emitter being connected with the reference voltage source, the base-emitter path of transistor $Q_3$ is connected in series with the collector-base path of transistor $Q_1$, and the collector-emitter path of transistor $Q_4$ is connected between the power supply source of +B and the reference voltage source, with the base being connected with the base of transistor $Q_1$. The output current $I_2$ is obtained from the output terminal 2 connected with the collector of transistor $Q_3$.

In the current mirror circuit constructed above, the output current $I_2$ which is n times as much as the input current $I_1$ is accurately available by forming the proportion of current flowing in transistors $Q_1 \sim Q_4$ as $1:n:1:n^2-1$. In FIG. 5, it is employed to form the proportion of the emitter areas of transistors $Q_1 \sim Q_4$ as $1:n:1:n^2-1$.

In such circuit, the output current $I_2$ is represented as follows:

$$I_2 = \frac{n\{h_{fe}^2 + (n+1)h_{fe}\}}{h_{fe} + 1} \quad (16)$$

The base current $i_{b3}$ of transistor $Q_3$ is expressed by:

$$i_{b3} = \frac{nh_{fe} + n^2 + n}{h_{fe} + 1} \cdot i_b \quad (17)$$

Accordingly, the input current $I_1$ is obtained as follows:

$$I_1 = \frac{h_{fe}^2 + (n+1)h_{fe} + n^2 + n}{h_{fe} + 1} \cdot i_b \quad (18)$$

Therefore, the current gain $I_2/I_1$ of this circuit is represented as follows:

$$I_2/I_1 = n \cdot \frac{h_{fe}^2 + (n+1)h_{fe}}{h_{fe}^2 + (n+1)h_{fe} + n^2 + n} \quad (19)$$

From the equation (19), it is realized that the current gain $I_2/I_1$ is substantially n, because the coefficients of $h_{fe}$ and $h_{fe}^2$ are equal between the denominator and the numerator.

In case of the circuit of FIG. 5, the currents flowing in transistors $Q_1 \sim Q_4$ are defined by the proportion of the emitter area of each transistor, but they are also defined by other methods.

Figure 6:
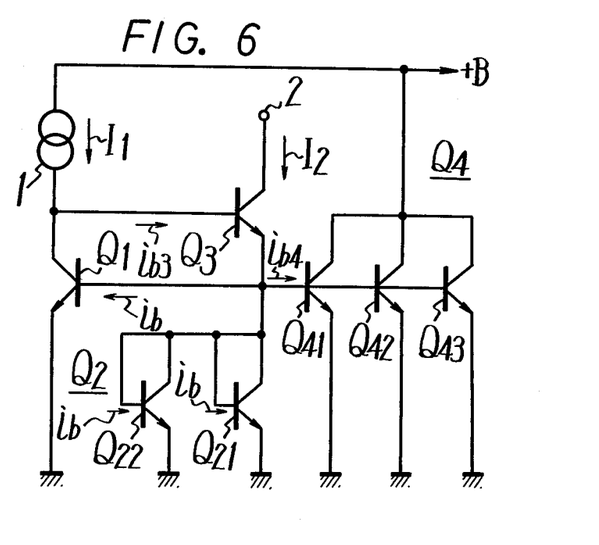

FIG. 6 shows another embodiment of the invention, in which the proportion of currents is defined by numbers of transistors of each transistor circuit. In this case, the second transistor circuit $Q_2$ consists of two parallel connected transistors $Q_{21}$ and $Q_{22}$, the third transistor circuit is formed of transistor $Q_3$ and the fourth transistor circuit $Q_4$ consists of three parallel connected transistors $Q_{41}$, $Q_{42}$ and $Q_{43}$.

The current gain $I_2/I_1$ is equal to the equation (19), where n=3 in this case.

Figure 7:
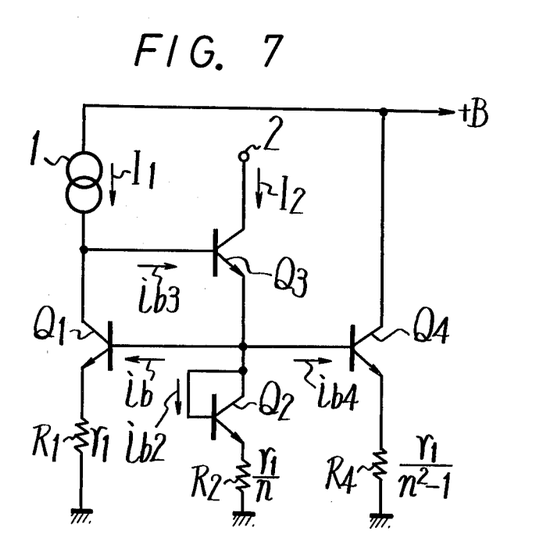

Another modification is shown in FIG. 7, in which the currents of transistor circuits are defined by connecting resisters $R_1$, $R_2$ and $R_4$, between the emitters of transistors $Q_1$, $Q_2$ and $Q_4$ and the reference voltage source, respectively. The values of these resisters $R_1$, $R_2$ and $R_4$ are $r_1$, $r_1/n$, $r_1/(n^2-1)$, respectively. The current gain $I_2/I_1$ is represented as the equation (19).

FIGS. 5 to 7 respectively show embodiments of this invention, in which a single output is drawn, but this invention is also adopted to current mirror circuits providing a plurality of output currents.

Figure 8:
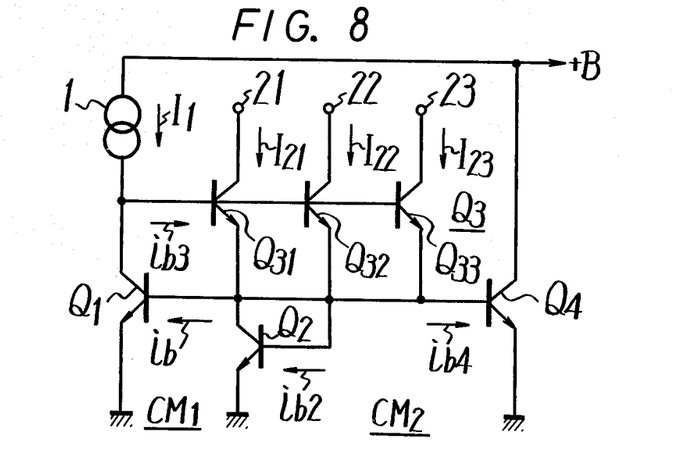
FIGS. 8 to 10 and FIGS. 14 to 16 are respectively schematic diagram of current mirror circuits each having a plurality of outputs according to this invention.

Referring now to FIG. 8, one embodiment of that type of the current mirror circuit according to the invention will be described, with elements corresponding to those described above with references to the prior art of FIG. 4 being identified by the same reference numerals. The circuit of FIG. 8 has added another transistor $Q_4$ to the circuit of FIG. 4, and this transistor $Q_4$ forms a second current mirror circuit $CM_2$ with transistor $Q_2$, which, at the same time, forms a first current mirror circuit $CM_1$ with transistor $Q_1$.

If, for example, three output currents $I_{21}$, $I_{22}$ and $I_{23}$, the proportion of which to the input current $I_1$ is p:q:r:1 are required, the currents flowing in transistors $Q_1$, $Q_2$ and $Q_4$ are formed in the proportion of 1:n:n²−1 among them, where $n=p+q+r$. In FIG. 8, there is employed to form the proportion of the emitter area of transistors $Q_1$, $Q_2$ and $Q_4$ as 1:n:n²−1 while that of transistors $Q_{31}$, $Q_{32}$ and $Q_{33}$ is formed as p:q:r.

From the above constructed current mirror circuit of the invention, the current gain $I_{21}/I_1$ is obtained as follows.

The base current $i_{b2}$ of transistor $Q_2$ is obtained as:

$$i_{b2} = n \cdot i_b \quad (20)$$

and the base current $i_{b4}$ of transistor $Q_4$ becomes as follows:

$$i_{b4} = (n^2 - 1) \cdot i_b \quad (21)$$

Further, the sum of emitter currents of transistors $Q_{31}$, $Q_{32}$, $Q_{33}$ is represented as follows:

$$i_b + (h_{fe} + 1) \cdot i_{b2} + i_{b4} = (n \cdot h_{fe} + n^2 + n) \cdot i_b \quad (22)$$

Therefore, the amount of base current $i_{b3}$ of transistors $Q_{31}$, $Q_{32}$ and $Q_{33}$ is expressed by:

$$i_{b3} = \frac{nh_{fe} + n^2 + n}{h_{fe} + 1} \quad (23)$$

And so the input current $I_1$ becomes as follows:

$$I_1 = h_{fe} \cdot i_b + i_{b3} \quad (24)$$

$$= \frac{h_{fe}^2 + (n+1) \cdot h_{fe} + n(n+1)}{h_{fe} + 1} \cdot i_b$$

On the other hand, one output current $I_{21}$ is obtained from the equation (22) as follows:

$$I_{21} = \frac{p\{h_{fe}^2 + (n+1)h_{fe}\}}{h_{fe} + 1} \quad (25)$$

Therefore, the current gain $I_{21}/I_1$ is obtained from the equations (24) and (25) as follows:

$$I_{21}/I_1 = p \cdot \frac{h_{fe}^2 + (n+1)h_{fe}}{h_{fe}^2 + (n+1)h_{fe} + n(n+1)} \quad (26)$$

The other current gains $I_{22}/I_1$ and $I_{23}/I_1$ are also obtained by substituting q and r for p in the equation (26), respectively.

From the equation (26), it is recognized that coefficients of $h_{fe}^2$ and $h_{fe}$ between the denominator and the numerator, therefore the current gain $I_{21}/I_1$ is very close to p as desired. In FIG. 8 all the currents flowing in transistors $Q_1 \sim Q_4$ are defined by the proportion of the emitter area of each transistor, but these currents are also defined by the number of these transistors or by connecting resistors to the emitter of each transistor having the same emitter area.

Figure 9:
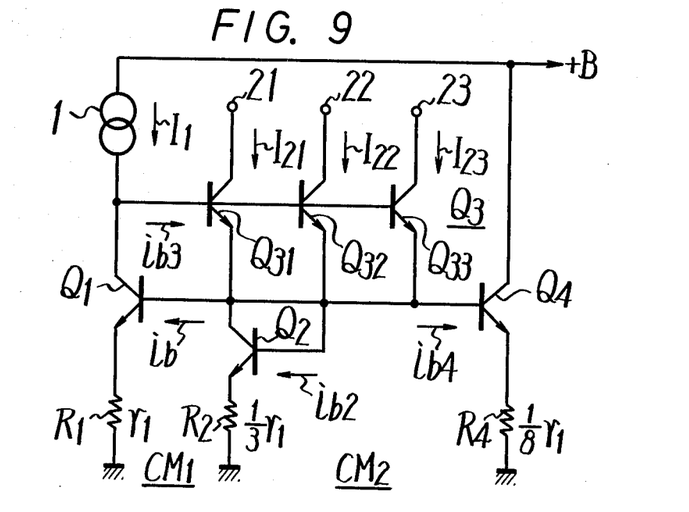

Referring to FIG. 9, there is shown another embodiment of the current mirror circuit of this invention, in which a plurality of outputs having the same value as the input current are obtained. In FIG. 9, the emitter areas of transistors $Q_1 \sim Q_4$ are all the same and resistors $R_1$, $R_2$ and $R_4$ are connected between respective emitters of transistors $Q_1$, $Q_2$ and $Q_4$ and the reference voltage source. The proportion of emitter areas of transistors $Q_{31}$, $Q_{32}$ and $Q_{33}$ is 1:1:1 and the emitter area of each transistor is equal to that of transistor $Q_1$, so that $n=p+q+r=1+1+1=3$ is obtained. Therefore, the value of resistors $R_1$, $R_2$ and $R_4$ is provided as $r_1$, $r_1/3$, $r_1/(3^2-1)$, respectively, to make the proportion of currents flowing in transistors $Q_1$, $Q_2$ and $Q_4$ as 1:n:n²−1.

According to the above explanation, the sum of output currents $I_{21}+I_{22}+I_{23}$ which is 3 times as much as the input current $I_1$ is obtained by connecting resistors $R_1$, $R_2$ and $R_4$, the values of which are $r_1$, $r_1/3$ and $r_1/8$, respectively, between respective emitters of transistors $Q_1$, $Q_2$ and $Q_4$ and the reference voltage source.

However, in addition to methods in FIG. 8 and 9, it is also possible to define the proportion of currents flowing in transistors $Q_1$, $Q_2$ and $Q_4$ by providing n transistors for transistor $Q_2$ and n²−1 transistors for transistor $Q_4$.

Figure 10:
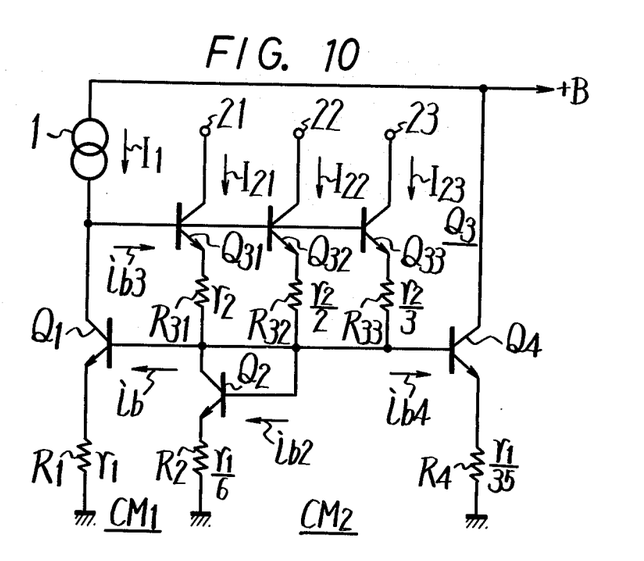

FIG. 10 shows a modification of FIG. 8, where p:q:r=1:2:3 and $n=p+q+r=6$. The currents flowing in transistors $Q_1 \sim Q_4$ are defined by emitter resistors $R_1$, $R_2$, $R_{31}$, $R_{32}$, $R_{33}$ and $R_4$ the values of which are $r_1$, $r_1/6$, $r_2$, $r_2/2$, $r_2/3$ and $r_1/35$, respectively. The operation of this circuit is the same as that of FIG. 8 and the output current $I_{21}$, $I_{22}$ and $I_{23}$ are substantially equal to $I_1$, $2I_1$, $3I_1$, respectively, according to the equation (26) by substituting 1, 2 and 3 for p.

Figure 11:
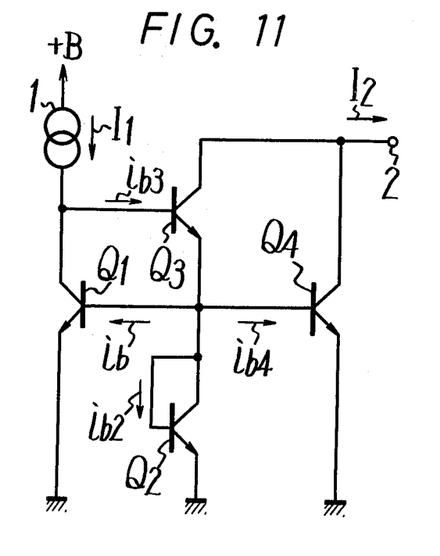

Referring, further, to FIG. 11, another embodiment of the current mirror circuit according to this invention will be described.

In FIG. 11, a series circuit of a current source 1 and the collector-emitter path of transistor $Q_1$ is connected between the power supply source of +B and the reference voltage source, the base and the collector of transistor $Q_2$ are connected together with the base of transistor $Q_1$, with the emitter of transistor $Q_2$ being connected with the reference voltage source, the base-emitter path of transistor $Q_3$ is connected in series with the collector-base path of transistor $Q_1$, and the collector-emitter path of the transistor $Q_4$ is connected between the collector of transistor $Q_3$ and the reference voltage source, with the base being connected with the base of transistor $Q_1$. The output current $I_2$ is obtained from the output terminal 2 connected with the junction point of the collecters of transistors $Q_3$ and $Q_4$.

In the above constructed current mirror circuit of the invention, the output current $I_2$, which is n times as much as the input current $I_1$, is accurately available by forming the proportion of currents flowing in transistors $Q_1 \sim Q_4$ as 1:m:1:mn−1. In FIG. 11, it is employed to form the proportion of emitter areas of transistors $Q_1$-$Q_4$ as 1:m:1:mn−1. The output current $I_2$ is obtained from the equations represented as follows.

The base current $i_{b3}$ of transistor $Q_3$ is represented as follows:

$$i_{b3} = \frac{1}{h_{fe}+1}(mh_{fe} + mn + m)i_b \quad (27)$$

Therefore, the output current $I_2$ which is the sum of the collector currents of transistors $Q_3$ and $Q_4$ is represented as follows:

$$I_2 = \frac{h_{fe}}{h_{fe}+1}(mh_{fe} + mn + m)i_b + h_{fe}(mn-1)i_b \quad (28)$$

$$= \frac{1}{h_{fe}+1}\{(mn+m-1)h_{fe}^2 + (2mn+m-1)h_{fe}\}i_b$$

while the input current $I_1$ is represented as follows:

$$I_1 = i_{b3} + h_{fe} \cdot i_b \quad (29)$$

$$= \frac{1}{h_{fe}+1}\{h_{fe}^2 + (m+1)h_{fe} + mn + m\}$$

From the equations (28) and (29), the current gain $I_2/I_1$ is represented as follows:

$$I_2/I_1 = \frac{(mn+m-1)h_{fe}^2 + (2mn+m-1)h_{fe}}{h_{fe}^2 + (m+1)h_{fe} + mn + m} \quad (30)$$

In the equation (30), if m=1 is substituted, $I_2/I_1$ is expressed by the following equation (31):

$$I_2/I_1 = n \cdot \frac{h_{fe}^2 + 2h_{fe}}{h_{fe}^2 + 2h_{fe} + n + 1} \quad (31)$$

The equation (31) shows that when the current of transistor $Q_2$ is equal to that of transistors $Q_1$ and $Q_3$ the current gain $I_2/I_1$ becomes substantially equal to n, because the coefficients of $h_{fe}^2$ and $h_{fe}$ are equal between the denominator and the numerator. In other words, it is necessary to form transistors $Q_1$, $Q_2$ and $Q_3$ to flow the currents equally in order to get the output current $I_2$ n times as much as the input current $I_1$ in this current mirror circuit.

In case of the circuit of FIG. 11, the currents flowing in transistors $Q_1 \sim Q_4$ are defined by the proportion of the emitter areas of transistors, but those currents are also defined by other methods.

Figure 12:
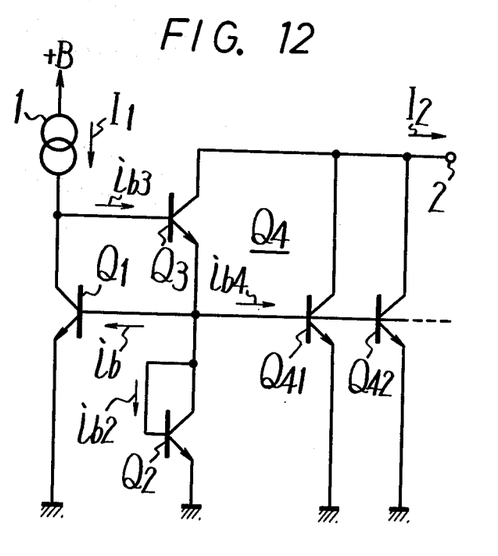

FIG. 12 shows another embodiment of this invention, in which the proportion of currents are defined by numbers of transistors of each transistor circuit.

In this case, the fourth transistor circuit $Q_4$ consists of a plurality of parallel connected transistors $Q_{41}$, $Q_{42}$ - - - . The current gain of this circuit is obtained from the equation (31), equally.

Figure 13:
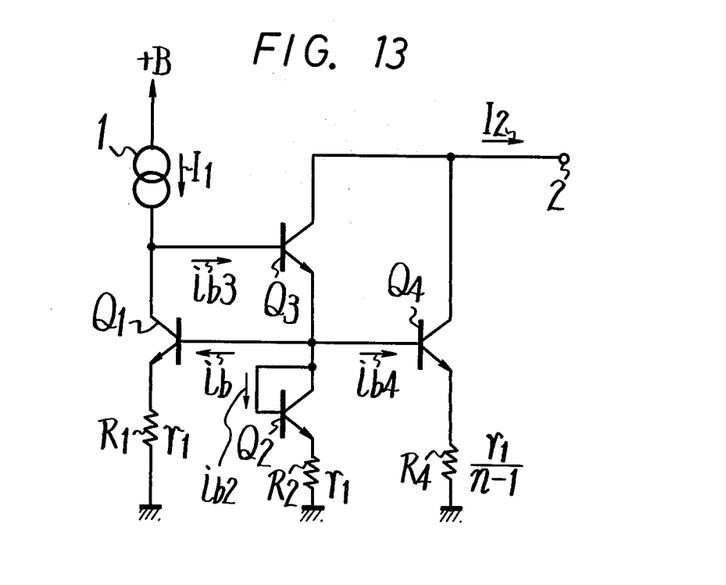

Another modification of this invention is shown in FIG. 13, in which the currents of transistor circuits are defined by connecting resistors $R_1$, $R_2$ and $R_4$ between the emitters of transistors $Q_1$, $Q_2$ and $Q_4$ and the reference voltage source, respectively. The values of resistors $R_1$, $R_2$ and $R_4$ are $r_1$, $r_1$ and $r_{1/n-1}$, respectively. The current gain $I_2/I_1$ of this circuit is also represented as the equation (30).

Figure 14:
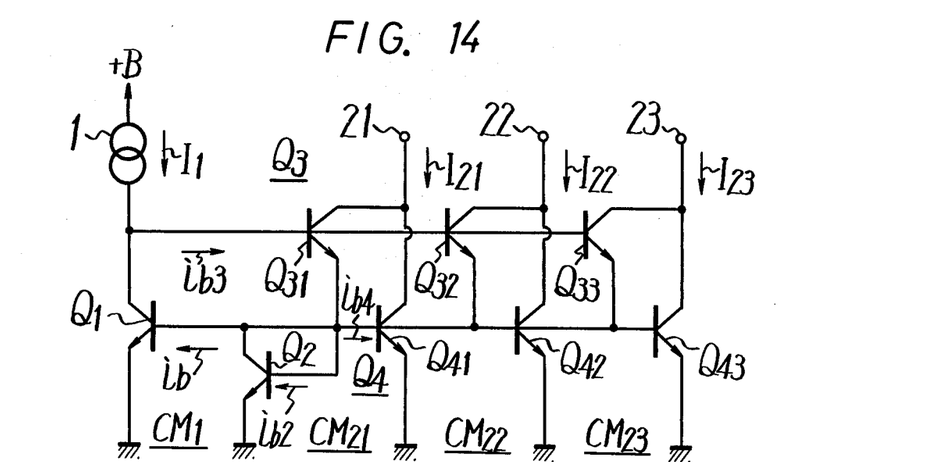
Figure 15:
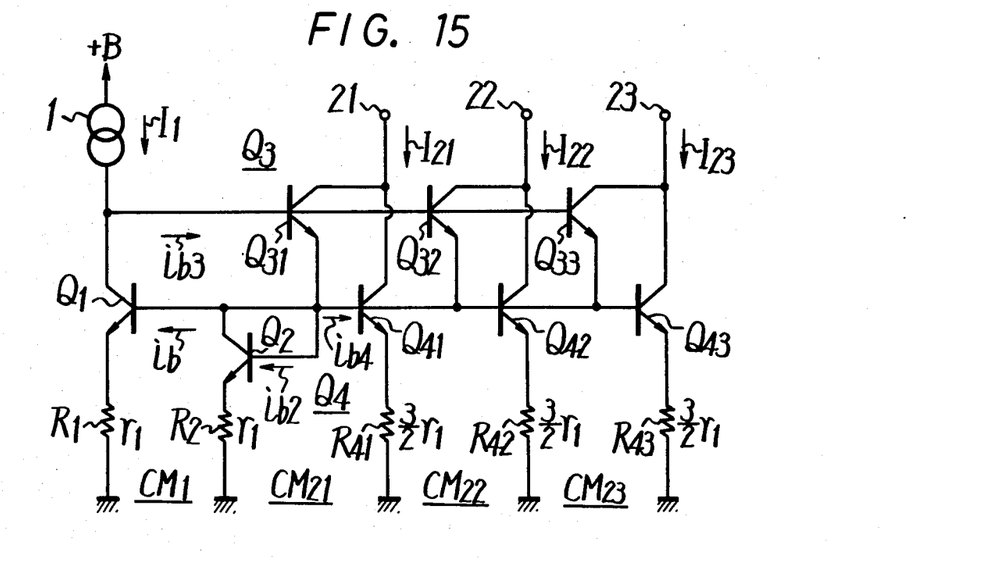
Figure 16:
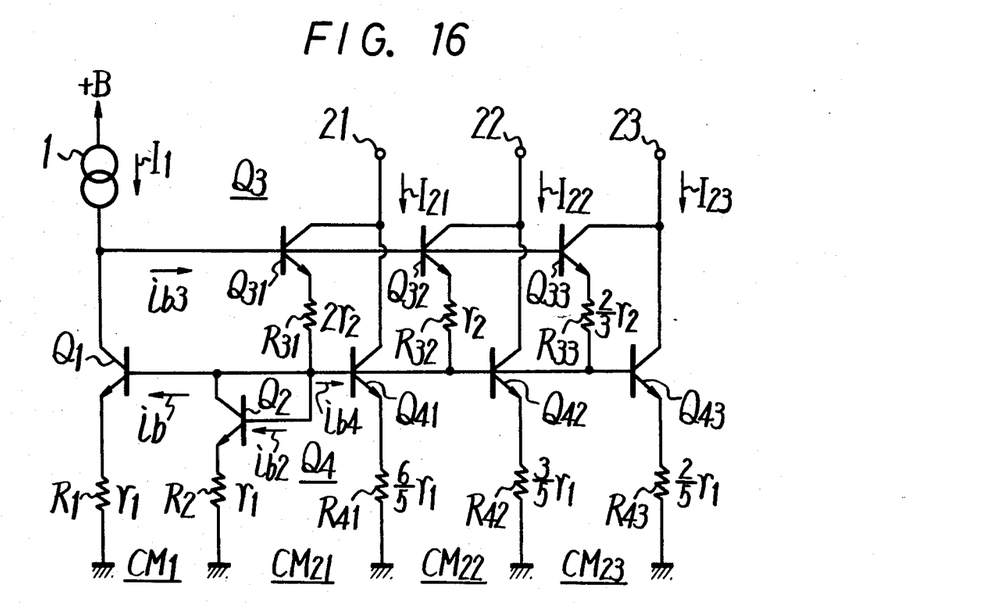

Referring now to FIGS. 14~16, there are shown modifications of FIG. 11, in which a plurality of outputs whose values can be chosen as desired.

In FIG. 14, elements corresponding to those described above with reference to the prior art of FIG. 4 are identified by the same reference numerals, with the fourth transistor circuit consisting of parallel connected transistors $Q_{41}$, $Q_{42}$, and $Q_{43}$ being added to the circuit of FIG. 4, and the collectors of transistors $Q_{41}$, $Q_{42}$ and $Q_{43}$ being connected with the collectors of transistors $Q_{31}$, $Q_{32}$ and $Q_{33}$, respectively. These transistors $Q_{41}$, $Q_{42}$ and $Q_{43}$ form current mirror circuits $CM_{21}$, $CM_{22}$ and $CM_{23}$, respectively, with transistor $Q_2$ which also form a current mirror circuit $CM_1$ with transistor $Q_1$.

In the circuit configuration above, if, for example, it is required that the current proportion of output currents $I_{21}$, $I_{22}$, $I_{23}$ to the input current $I_1$ is p:q:r:1, the proportion of the currents of transistors $Q_1$, $Q_2$, $Q_{41}$, and $Q_{42}$ and $Q_{43}$ are set as 1:m:a:b:c, where m=1 is adequate for this circuit according to the description of FIG. 11. In case of the circuit of FIG. 14, such proportion of the currents of transistors $Q_1$, $Q_2$, $Q_{41}$, $Q_{42}$ and $Q_{43}$ is defined by the proportion of emitter areas of those transistors. And then, a, b, c are chosen as $a=p(n-1)/n$, $b=q(n-1)/n$ and $c=r(n-1)/n$, where $n=p+q+r$, and the proportion of emitter areas of transistors $Q_{31}$, $Q_{32}$ and $Q_{33}$ are formed as p:q:r to obtain the output currents the proportion of which to the input current $I_1$ is p:q:r:1.

The current gain, for example, $I_{21}/I_1$ is obtained from the equations as follows.

The sum of base current $i_{b3}$ of transistors $Q_{31}$, $Q_{32}$ and $Q_{33}$ is represented as follows:

$$i_{b3} = \frac{h_{fe} + n + 1}{h_{fe} + 1} \cdot i_b \qquad (32)$$

Therefore, the input current $I_1$ is represented as follows:

$$I_1 = h_{fe} \cdot i_b + i_{b3} \qquad (33)$$
$$= \frac{h_{fe}^2 + 2h_{fe} + n + 1}{h_{fe} + 1}$$

The output current $I_{21}$ is the sum of the collector currents of transistors $Q_{31}$ and $Q_{41}$, therefor it is represented as follows.

$$I_{21} = h_{fe} \cdot \frac{p}{n} \cdot i_{b3} + h_{fe} \cdot a \cdot i_b \qquad (34)$$
$$= \frac{p \cdot \{h_{fe}^2 + (n+1)h_{fe}\}}{h_{fe}+1} + p \cdot \frac{n-1}{n} \cdot h_{fe} \cdot i_b$$
$$= p \cdot \frac{h_{fe}^2 + 2h_{fe}}{h_{fe}+1} \cdot i_b$$

From the equations (33) and (34) the current gain $I_{21}/I_1$ is obtained as follows:

$$I_{21}/I_1 = p \cdot \frac{h_{fe}^2 + 2h_{fe}}{h_{fe}^2 + 2h_{fe} + n + 1} \qquad (35)$$

From the equation (35), it is realized that the current gain $I_{21}/I_1$ is substantially equal to p, because the coefficients of $h_{fe}^2$ and $h_{fe}$ are equal between the denominator and the numerator.

The other current gains $I_{22}/I_1$ and $I_{23}/I_1$ are also obtained by substituting q and r for p, respectively, in the equation (35).

In FIG. 14, the currents of transistors $Q_1$, $Q_2$, $Q_{31}$, $Q_{32}$, $Q_{33}$, $Q_{41}$, $Q_{42}$, and $Q_{43}$ are all defined by the proportion of the emitter area of each transistor, but these currents are also defined by the number of these transistors or by connecting resisters with the emitter of these transistors, respectively.

Referring to FIG. 15, there is shown another embodiment of this invention, in which a plurality of outputs having the same value as that of the input current are obtained. Here, $p=q=r=1$ $n=3$, $n-1=2$ and $a=b=c=\frac{2}{3}$ are the values of each coefficient. The emitter areas of transistors $Q_1$, $Q_2$, $Q_{31}$, $Q_{32}$, $Q_{33}$, $Q_{41}$, $Q_{42}$ and $Q_{43}$ are all formed equal and the emitters of transistors $Q_1$, $Q_2$, $Q_{41}$, $Q_{42}$ and $Q_{43}$ are connected with the reference voltage source through respective resistors $R_1$, $R_2$, $R_{41}$, $R_{42}$ and $R_{43}$, the values of which are $r_1$, $r_1$, $3/2r_1$, $3/2r_1$, $3/2r_1$, respectively, where $r_1$ is a desired value.

FIG. 16 shows a modification of FIG. 14, where p:q:r=1:2:3, $n=p+q+r=6$, therefor $a=p(n-1)/n=5/6$, $b=q(n-1)/n=10/6$, $c=r(n-1)/n=15/6$, respectively.

The currents flowing in transistors $Q_1$, $Q_2$, $Q_{31}$, $Q_{32}$, $Q_{33}$, $Q_{41}$, $Q_{42}$ and $Q_{43}$ are defined by emitter resistors $R_1$, $R_2$, $R_{31}$, $R_{32}$, $R_{33}$, $R_{41}$, $R_{42}$ and $R_{43}$, the values of which are $r_1$, $r_1$, $2r_2$, $r_2$, $\frac{2}{3}r_2$, $6/5r_1$, $3/5r_1$, $2/5r_1$, respectively. The operation of this circuit is the same as that of FIG. 14 and the output currents $I_{21}$, $I_{22}$ and $I_{23}$ are substantially equal to $I_1$, $2I_1$ and $3I_1$ respectively according to the equation (35) by substituting 1, 2 and 3 for p.

Having described specific preferred embodiments of the invention with reference to the accompanying drawings, it is to be understood that the invention is not limited to those precise embodiments, and that various changes and modifications may be effected therein by one skilled in the art without departing from the scope or the spirits of the novel concepts of the invention as defined in the appended claims.

What is claimed is:

1. A current mirror circuit comprising: a power supply source, a series circuit of a current source and the collector-emitter path of a first transistor, said series circuit being connected between said power supply source and a reference voltage source, and a second transistor circuit having a control electrode connected with the base of said first transistor and a main current path connected between the base of said first transistor and said reference voltage source, characterized by: a third transistor circuit having a control electrode connected with the collector of said first transistor and a main current path one terminal of which is connected with the base of said first transistor; and a fourth transistor circuit having a control electrode connected with the base of said first transistor and a main current path one terminal of which is connected with said reference voltage source, in which the other terminal of said main current path of said fourth transistor is connected with said power supply source, in which said third transistor circuit consists of a plurality of transistors which have their control electrodes and one of their main current path electrodes respectively connected together and a plurality of output terminals connected respectively to the other main current path electrodes, and in which the current proportion among said first transistor, said second transistor and said fourth transistor is $1:n:n^2-1$ and the sum of output currents obtained from said output terminals in n times as great as the input current obtained from said current source.

2. A current mirror circuit according to claim 1, in which said current proportion is defined by the proportion of emitter areas among said first transistor, said second and said fourth transistor circuit.

3. A current mirror circuit according to claim 2, in which an output current of each of said parallel connected plurality of transistors is of desired value by forming the proportion of emitter areas among said parallel connected plurality of transistors as desired, respectively.

4. A current mirror circuit according to claim 2, including a first emitter resistor connected between the emitter of said first transistor and said reference voltage source, a second emitter resistor connected between the emitter of said second transistor circuit and said reference voltage source and a third emitter resistor connected between the emitter of said fourth transistor circuit and said reference voltage source.

5. A current mirror circuit according to claim 1, in which said current proportion is defined by the numbers of transistors of said second and said fourth transistor circuits.

6. A current mirror circuit according to claim 5, in which an output current of each of said parallel connected plurality of transistors is of desired value by forming the proportion of emitter areas of said parallel connected plurality of transistors as desired, respectively.

7. A current mirror circuit according to claim 5, in which an output current of each of said parallel connected plurality of transistors is of desired value by connecting emitter resistors having desired values with the emitters of said parallel connected plurality of transistors, respectively.

8. A current mirror circuit according to claim 1, in which said second and said fourth transistor circuits consist of a second and a fourth transistors, respectively and resistors are connected with emitters of said first, said second and said fourth transistors, respectively, to define said current proportion among said first, said second and said fourth transistors.

9. A current mirror circuit according to claim 8, in which an output current of each of said parallel connected plurality of transistors is of desired value by forming the proportion of emitter areas of said parallel connected plurality of transistors as desired, respectively.

10. A current mirror circuit according to claim 8, in which an output current of each of said parallel connected plurality of transistors is of desired value by connecting emitter resistors having desired values with the emitters of said parallel connected plurality of transistors, respectively.

11. A current mirror circuit according to claim 1, in which an output current of each of said parallel connected plurality of transistors is of desired value by forming the proportion of emitter areas among said parallel connected plurality of transistors as desired, respectively.

12. A current mirror circuit according to claim 1, in which an output current of each of said parallel connected plurality of transistors is of desired value by connecting emitter resistors having desired values with the emitters of said parallel connected plurality of transistors, respectively.

13. A current mirror circuit comprising, a power supply source, a series circuit of a current source and the collector-emitter path of a first transistor, said series circuit being connected between said power supply source and a reference voltage source; and a second transistor $Q_2$ having a control electrode connected with the base of said first transistor and a main current path connected between the base of said first transistor and said reference voltage source, characterized by: a third transistor $Q_3$ having a control electrode connected with the collector of said first transistor and a main current path one terminal of which is connected with the base of said first transistor, a fourth transistor $Q_4$ having a control electrode connected with the base of said first transistor and a main current path one terminal of which is connected with said reference voltage source, in which the other terminal of said main current path of said third transistor is connected to an output terminal and the other terminal of said main current path of said fourth transistor is connected to said output terminal, a fifth transistor with its control electrode connected to the collector of said first transistor, and its main current path with one terminal connected to the base of said first transistor and the other terminal connected to a second output terminal, a sixth transistor having a control electrode connected with the base of said first transistor and its main current path connected with one terminal to said reference voltage and the other terminal to said second output terminal.

14. A current mirror circuit according to claim 13 including first, second, third and fourth emitter resistors connected to the emitters of said, first, second, fourth and sixth transistors.

15. A current mirror circuit according to claim 14 including fifth and sixth resistors connected to the emitters of said third and fifth transistors.

* * * * *